United States Patent [19]

Walkerow

[11] Patent Number: 5,800,043

[45] Date of Patent: Sep. 1, 1998

[54] ILLUMINATED FUSE EXTRACTING AND INSTALLING TOOL AND TESTER

[76] Inventor: Loy P. Walkerow, Box 344, Marion St., Nashville, Ohio 44661

[21] Appl. No.: 738,815

[22] Filed: Oct. 28, 1996

[51] Int. Cl.[6] ............................................. F21V 33/00
[52] U.S. Cl. ........................ 362/119; 362/253; 81/38
[58] Field of Search ............................ 362/119, 120, 362/109, 110, 113; 81/3.8

[56] References Cited

U.S. PATENT DOCUMENTS

| | | | |
|---|---|---|---|
| 1,053,770 | 2/1913 | Barager . | |
| 1,455,878 | 5/1923 | Grinnell | 81/3.8 |
| 1,927,528 | 9/1933 | Nilsson | 81/3.8 |
| 1,989,645 | 1/1935 | Podell . | |
| 2,023,916 | 12/1935 | Dante | 81/3.8 |
| 2,454,878 | 11/1948 | Marler | 81/3.8 |
| 2,811,631 | 10/1957 | Wood, Jr. | 81/3.8 |
| 3,627,367 | 12/1971 | Levy | 81/3.8 |
| 4,314,383 | 2/1982 | Epstein . | |
| 4,414,698 | 11/1983 | Epstein | 81/3.8 |
| 4,475,283 | 10/1984 | Olson et al. | 29/720 |
| 4,912,841 | 4/1990 | Noschese | 29/764 |
| 5,446,388 | 8/1995 | Chick | 324/550 |

*Primary Examiner*—Thomas M. Sember
*Attorney, Agent, or Firm*—Sand & Sebolt

[57] ABSTRACT

The present invention is a fuse extracting tool and tester that is capable of extracting and testing both barrel type and flat prong type fuses. The fuse extracting tool and tester is trigger driven where the trigger also functions to activate a spot light for providing light in the area in which the fuse to be extracted would be located.

27 Claims, 8 Drawing Sheets

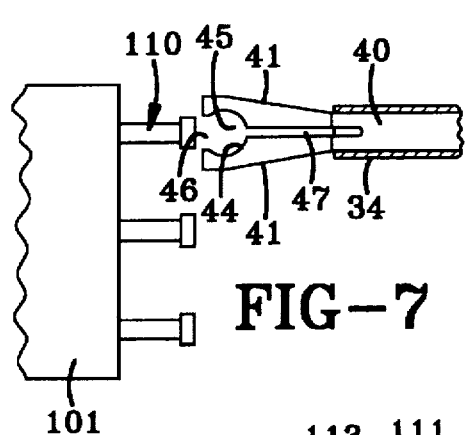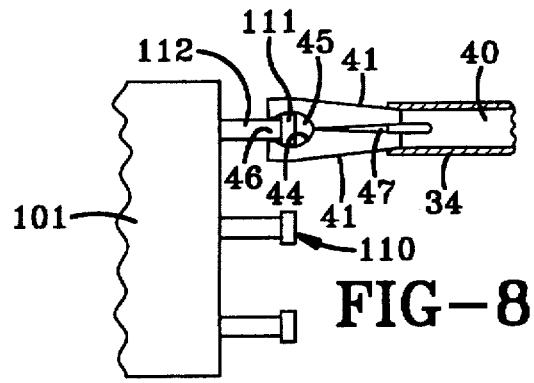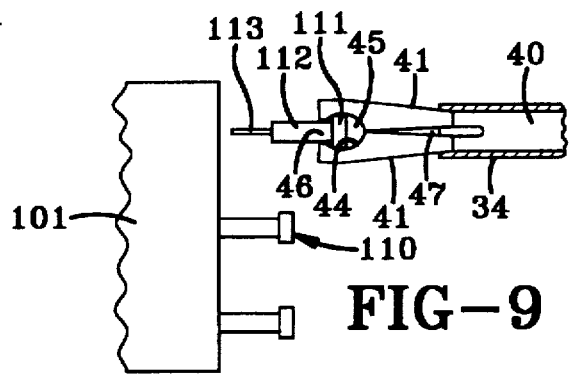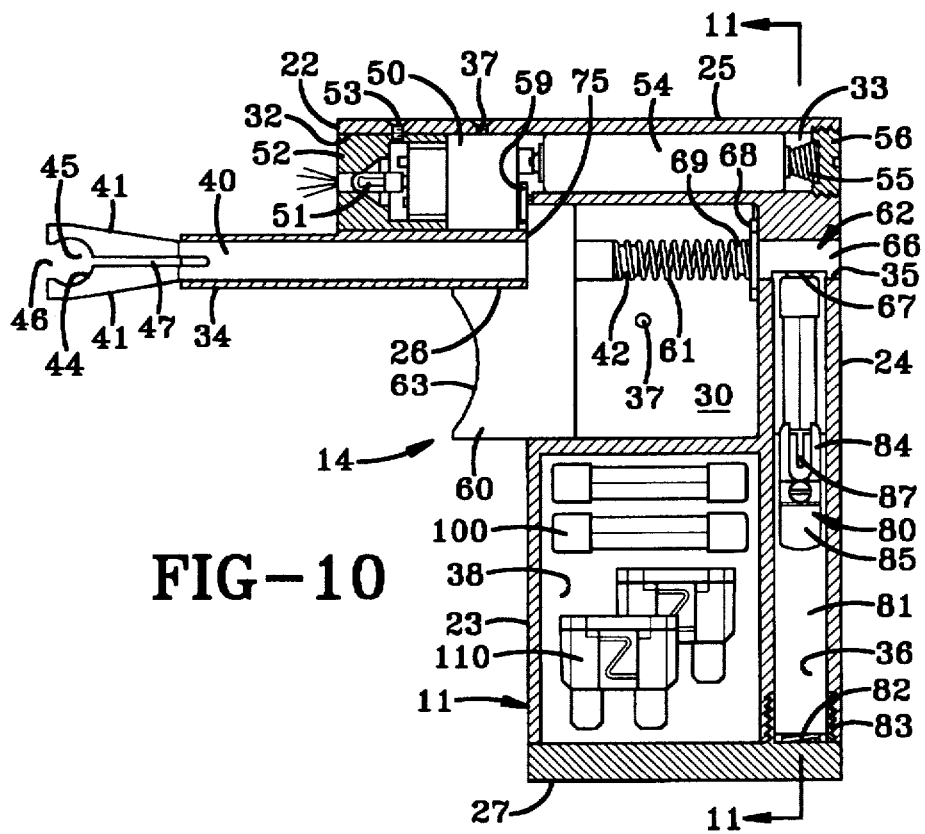

ILLUMINATED FUSE EXTRACTING AND INSTALLING TOOL AND TESTER

BACKGROUND OF THE INVENTION

1. Technical Field

The present invention is generally directed to a tool for extracting, installing and testing fuses, and more particularly to a hand held, trigger driven fuse extractor. Specifically, the present invention is an improved fuse extractor utilized to extract both standard round and flat prong fuses using a pair of gripper arms compressible toward each other and slidably attached within a conduit to a hand held, trigger driven body having a spot light and fuse tester built therein.

2. Background Information

With the advent and rapid expansion of electricity in the twentieth century, the use of fuses to alleviate excessive current within an electrical circuit prior to damage occurring to the overall circuit and/or device has become both popular and necessary. Specifically, a significant industry has developed for supplying fuses that are used in almost all electrical applications, particularly in the automobile market. Each automobile and home contains at least one central fuse box or fuse board through which all of the electricity passes after local generation or local receipt from remote generation but prior to distribution throughout the automobile or home to the specific electrical demands.

It is not unusual for the current to surge within the electrical circuits connected to the electrical power source. Without fuses, any surge would pass through the wiring to the end current user such as a headlight in an automobile where the filament or other fragile circuitry therein would be melted, burned up, or otherwise damaged by the excess current. For this reason, fuses are inserted into nearly all electrical circuits.

The fuse in each electrical circuit basically provides a single path through which the current must pass. Specifically, a controlled section of conductor provides a conductive path through which current must pass where excessive current, as defined as current that exceeds a rated value for a defined period of time, melts the section of conductor thereby severing the circuit. Typically, this section of conductor is surrounded by a vacuum or other non-conductive chamber.

One environment in which fuses are very prevalent is the automobile. In today's automobiles, all or a large portion of the fuses are situated in one common location referred to as a fuse block. The fuse block contains multiple ports, each of which houses one fuse.

Two of the principal fuse types in today's automobile fuse market are the barrel or cylindrical fuse and the flat prong fuse. The barrel type fuse is an elongated cylindrical chamber housing a fragile conductor wire therein through which all current must pass. Each end of the cylindrical chamber is capped by a conductive cap that is electrically connected to one end of the conductor wire. Each barrel fuse snaps into a pair of holders in the fuse block where each holder is a pair of curved conductors through which the electrical circuit flows. Each curved conductor is of a flat C-shape. The curved conductors are attached to the fuse block on one end and positioned outward therefrom so that the open side of each "C" face each other thereby defining a substantially cylindrical space for receiving a fuse. The other ends of each curved conductor converge but typically do not touch thereby defining the access opening through which the fuse is inserted. The access opening is smaller than the diameter of the fuse but allows passage of the fuse by deflecting open under pressure. The substantially cylindrical space of each holder is aligned so that the capped ends snap into the holders during installation.

The flat prong fuse is a relatively planar fuse with a pair of male conductors insertable into a pair of female conductive holes within the fuse block. An insulator encapsulates one end of each male conductor. A fragile conductor wire passes through the insulator to connect the male conductors for supplying a path through which all electrical current must pass.

In either case, these fuse types are very well known in the art and have been in existence for many years. Typically, the fuse seats within the fuse block in a very tight manner to assure a good electric path is supplied. The result of this tight fit is difficulty in removing the fuse to test or replace the fuse. In addition, the fuse blocks are often located in difficult to reach or work in places such as under the dashboard inside the interior of the vehicle, or on the fire wall either inside the vehicle interior and beneath the dashboard of a vehicle or under the hood and behind numerous engine components on a vehicle. For both of these reasons, fuse pullers were invented and have been used since the early 1900's. Fuse pullers provide a means for engaging the fuse and removing it from its tight fit within the fuse block which is typically positioned in a difficult to reach spot. One example of such a fuse puller is U.S. Pat. No. 1,053,770 issued in 1913 and disclosing a fuse puller with an insulative handle connected to a pair of gripping jaws having crossed levers thereon.

SUMMARY OF THE INVENTION

Accordingly, it is an object of the present invention to provide a fuse extractor capable of quick and easy removal of fuses from fuse blocks.

It is another object of the invention to provide a fuse extractor having a light focusing on the extraction area.

A related object of the present invention is to provide a fuse extractor that includes a fuse tester therein.

A still further objective of the present invention is to provide a fuse extractor with a light that is automatically turned on by movement of the fuse extracting jaws.

Still another object of the present invention is to provide a fuse extractor that is capable of removing multiple fuse types including both barrel and flat prong type fuses.

Yet another object of the present invention is to provide a more compact fuse extractor design lacking the standard scissor mechanism based upon the compact locations in which the extractor is typically used.

A further object of the present invention is to provide a hand-held fuse extractor requiring only one handed usage.

An even further object of the invention is to provide an ergonomic fuse extractor that is contoured to a typical user's hand dimensions thereby supplying a comfortable fit and location of the necessary elements.

A yet even further object of the invention is to provide a fuse storage area so that the fuse extractor is a complete fuse removal, testing and replacing package.

Another object of the present invention is to provide a testing circuit within the fuse extractor capable of testing both barrel and flat prong type fuses.

Still other advantages and benefits of the invention will become apparent to those skilled in the art upon a reading and understanding of the following summary and detailed description.

Accordingly, the present invention satisfies these and other objects. Specifically, the present invention relates to a

3 fuse extractor capable of extracting both barrel type and flat prong type fuses from a fuse block. The fuse extractor including an extractor body that has means for extracting a fuse from a fuse block and means for illuminating the fuse block. The extraction means are attached to the extractor body, and include means for gripping the fuse and trigger means for actuating the gripping means to grip the fuse. The means for illuminating the fuse block are attached to the trigger means whereby actuation of the trigger means causes illumination of the illumination means.

BRIEF DESCRIPTION OF THE DRAWINGS

A preferred embodiment of the invention, illustrative of the best mode in which the applicant has contemplated applying the principles, is set forth in the following description and is shown in the drawings and is particularly and distinctly pointed out and set forth in the appended claims.

FIG. 7 is a partial side view similar to FIG. 4 except the fuse is flat prong type;

FIG. 8 is the same partial side view as FIG. 7 except the flat prong type fuse has been engaged similar to the engagement of the barrel type fuse in FIG. 5;

FIG. 9 is the same partial side view as FIGS. 7–8 except the flat prong type fuse has been extracted similar to the extraction of the barrel type fuse in FIG. 6;

FIG. 10 is a side sectional view of the improved fuse extractor with spare fuses stored in the storage compartment and with a barrel type fuse inserted into the fuse tester;

Similar numerals refer to similar parts and elements throughout the drawings.

4

DESCRIPTION OF THE PREFERRED EMBODIMENT

Figure 1:
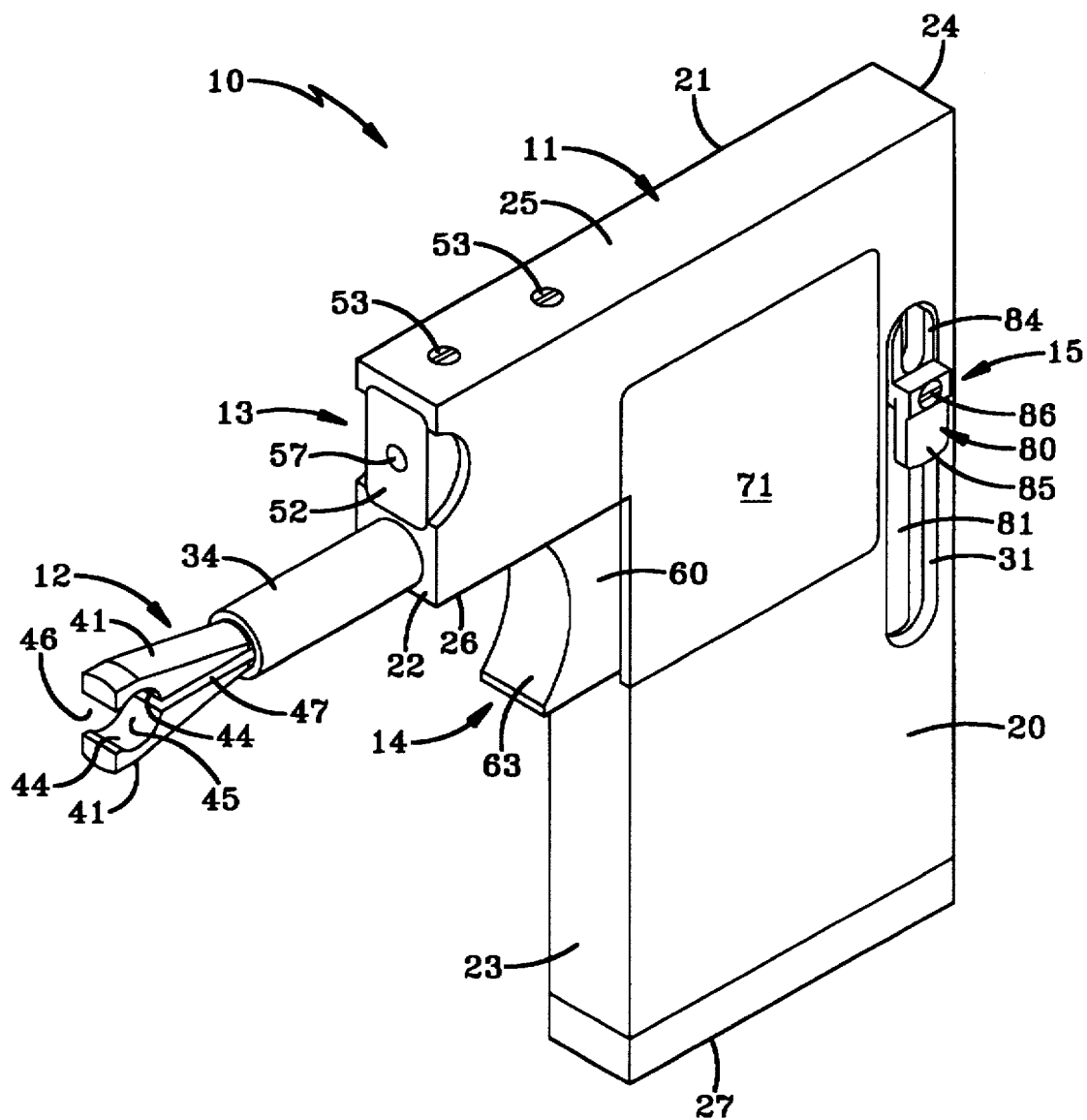
FIG. 1 is a perspective view showing the improved fuse extraction tool of the present invention.

A preferred embodiment of the present invention is shown generally in FIG. 1. The present invention is an improved fuse extractor 10 for extracting and installing various fuse types including barrel and flat prong fuse types from a secured position within a fuse block. The fuse extractor 10 includes a pistol grip shaped main body 11, an extractor mechanism 12, a light mechanism 13, a trigger mechanism 14, and a fuse testing mechanism 15. Each of these mechanisms and the parts therein is shown in more detail in the exploded perspective of FIG. 2 and described in more detail below.

The main body 11 is a rigid structure having a pair of opposed side faces 20 and 21, an upper front face 22, a lower front face 23, a back face 24, a top face 25, and a pair of bottom faces 26 and 27. The main body 11 includes an outward extension from which the extractor mechanism 12 and the light mechanism 13 extend. Side face 20 includes a trigger cavity 30 and a fuse tester handle window 31. Upper front face 22 includes a light mechanism receptacle 32 that extends completely through the main body 11 to a battery cavity or receptacle 33 in the back face 24. The upper front face also includes a tubular extension 34 for housing the trigger mechanism 14 therein. The tubular extension 34 defines an elongated chamber extending into the main body and into the trigger cavity 30, as well as across the trigger cavity whereby a rod seat or hole 35 in alignment with the chamber is defined. Bottom face 27 includes a fuse tester housing cavity 36 that extends into main body 11 and includes fuse tester handle window 31. Top face 25 includes a pair of holes 37 and side face 21 includes one hole 37, all for receiving screws therein during assembly of the various internal mechanisms.

Main body 11 also includes a fuse storage cavity 38 (FIG. 5) which is a hollow chamber within the main body 11 in which spare fuses may be stored where the chamber may be of any size or construction so as to be capable of storing one or more fuses of any type. Bottom face 27 functions as a pivotable door access to the cavity 38.

Main body 11 may be constructed out of any insulative material and manufactured in any manner. In the preferred embodiment, the main body 11 is manufactured of an insulative polymer that is molded to form the main body configuration.

The extractor mechanism 12 includes an elongated rod 40 with gripping arms 41 connected thereto. The rod 40 includes a reduced diameter spring seat 42 in one end and a trigger engaging notch 43 cut out in its midsection. The rod 40 is slidably positioned within the chamber defined by the tubular extension 34.

In the preferred embodiment, a pair of gripping arms are connected to the rod 40. Each gripping arm 41 includes a substantially semi-cylindrical notch 44. The notch 44 on each arm 41 faces the other notch thereby defining an approximately cylindrical fuse engaging or holding cavity 45. A gap 46 exists between the ends of each arm 41 through which a fuse is forcibly pushed or pulled during fuse insertion or extraction. The arms 41 are also separated by a slot 47 that extends back into the rod 40.

The light mechanism 13 includes a light base 50, a light bulb 51, a light cap 52, a pair of screws 53, a power source 54, a spring 55, and a threaded cap 56. The light base 50 includes a light receptacle in which the light bulb 51 is removably seated where the light receptacle includes the necessary conductors and wiring to connect the bulb to the power source 54 which in the preferred embodiment is a standard battery. The light cap 52 includes a hollow interior for receiving the light emitting portion of the light bulb 51 and a portion of the light base 50. The light cap further includes a light passage 57 for emitting light from the light bulb 51 without exposing the light bulb outside of the interior of the light cap 52 thereby both protecting the bulb from breaking as well as directing the light to focus on a particular spot in the proximity of the extractor mechanism 12. Each of the light base 50 and light cap 52 have a hole 58 therein for securing the base and cap in position. The light base also includes a spring-loaded activator button 59.

Trigger mechanism 14 includes a trigger 60, a trigger spring 61, and a trigger extractor base 62. The trigger 60 has a curved finger seat 63 and a rod engaging section 64 with a notch 65 therein. The trigger base 62 has a tubular base portion 66 with a flat face 67, a flange portion 68 with a spring seat 69 thereon, and a connection wire 70. Connecting wire 70 connects testing mechanism 15 to light base 50 to assure that light base 50 operates when the circuit is completed within tester mechanism 15 by insertion of a viable fuse. A cover plate 71 covers the opening that provides assembly access to the trigger cavity 30.

The tester mechanism 15 includes a slide handle 80, a sleeve 81 with a slot 87 therein, a spring 82, and a threaded base 83 molded or otherwise affixed to the bottom face 27. Sleeve 81 slides within fuse testing mechanism housing cavity 36. Handle 80 includes an inner mechanism 84 for stabilizing the sleeve 81, and an outer mechanism 85 for supplying a face from which to slide the handle. Handle 80 is fastened to sleeve 81. A screw 86 attaches the handle to the sleeve.

In the preferred embodiment, the pair of gripping arms 41 are connected to the rod 40 such that the approximately cylindrical fuse engaging cavity 45 is defined. Cavity 46 provides an opening into holding cavity 45 through which a fuse is forcibly pushed or pulled during fuse insertion or extraction. The gripping arms 41 are connected to rod 40 and extend therefrom in such a manner that the arms are separated by slot 47. This slot 47 provides the necessary bending in the arms to allow the arms to separate further at gap 46 when a fuse is forced into the gap 46 during fuse extraction. Alternatively, slot 47 may be sized somewhat larger than the fuse such that the fuse is grasped when trigger 60 is depressed.

In addition, the pair of gripping arms 41 are configured in a generally conical manner so as to limit their movement within tubular extension 34. Specifically, The outer surface of each of the gripping arms 41 angles outward toward the end of the gripping arm. This outward angling results in a distance between the outside surfaces of the opposing gripping arms that is larger than the diameter of the elongated rod 40. However, the slot 47 as described above supplies the arms with sufficient bending due to the construction of the arms as a cantilever spring bendable toward the other arm in such as a manner so as to close the slot 47 and gap 46 resulting in a reduction in the distance between the outside surface of the opposing gripping arms. This reduction allows the gripping arms to at least partially slide into the tubular extension 34. The trigger mechanism 14 as described above is the actuator of this bending via axial motion of elongated rod 40.

Another important design parameter involves the spring loaded activator button 59. This button 59 is bias outward from light base 50. This button 59 is in contact with trigger 60 adjacent notch 65. Trigger 60 is bias by spring 61 such that trigger 60 forces activator button 59 inward in close proximity to light base 50 by overcoming the bias present in button 59 from a spring or other biasing mechanism. Therefore, when activator button 59 is depressed or in close proximity to light base 50, the lighting circuit is not closed and therefore light bulb 51 is not illuminated, while in contrast when the activator button 59 is fully extended away from light base 50 then the lighting circuit is closed and light bulb 51 is therefore illuminated.

As to assembly of the main components of the fuse extractor 10, the extractor mechanism 12, the light mechanism 13, the trigger mechanism 14 and the fuse tester mechanism 15 each require some assembly as it is described in general below. The below described order is just one of numerous possibilities which would be obvious to one skilled in the art.

The light mechanism 13 is assembled as follows. The light base 50 and light cap 52 are inserted through light mechanism receptacle 32 until the holes 37 in the top face 25 align with the holes 58 in the base and cap. Specifically, the activator button side of the light base 50 is inserted such that the button 59 is directed toward the back of the light mechanism receptacle 32. The light bulb 51 is installed in base 50. The light cap is then inserted over the bulb 51 and fastened to base 50. The screws 53 are inserted through holes 37 in the top face 25 and into the holes 58 in the light base and light cap thereby securing the base and cap in place. Battery 54 is inserted into battery cavity 33 such that the battery is in electrical contact with the light bulb 51 through light base 50. Spring 55 rests behind the battery thereby holding the battery in tight electrical contact with the necessary conductors. The threaded cap 56 compresses the spring against the battery, and closes off the battery cavity 33.

The extractor and trigger mechanisms 12 and 14 are assembled as follows. The base portion 66 is inserted into rod base 35. Spring 61 is seated onto spring seats 69 and 42 as rod 40 is inserted into the chamber defined by tubular extension 34. The trigger 60 is connected to the elongated rod 40 at the trigger engaging notch 43 by interlocking the two corresponding notches 43 and 65 whereby the trigger acts to hold the rod 40, spring 61 and base 62 within the trigger cavity 30. The spring 61 acts to push rod 40 as far out in the tubular extension 34 as possible such that the trigger 60 rests against the wall 75 of the trigger cavity. The trigger 60 based upon the spring bias has engaged activator button 59, and pressed it inward into close proximity with light base 50.

The fuse tester mechanism 15 is assembled as follows. A screw 86 attaches the handle to the sleeve such that the handle extends outward through fuse tester handle window 31 thereby constraining sliding motion to the limits of the window 31. A screw 86 attaches the handle to the sleeve 81. Sleeve 81 includes a slot 87 in the end in close proximity to the handle. Spring 82 is partially positioned within hollow sleeve 81 extending out of the sleeve and into engagement with base 83 when the base is threaded into cavity 36. The spring thereby acts to bias the sleeve 81 and handle 80 upward into engagement with the flat face 67 in the tubular base portion 66. The handle 80 is then used to compress the spring 82 by sliding the handle 80 within the window 31 thereby allowing a fuse to be inserted in between the flat face 67 and the handle 80. The bottom face 27 secures the fuse tester mechanism 15 within the fuse tester cavity 36.

Figure 2:
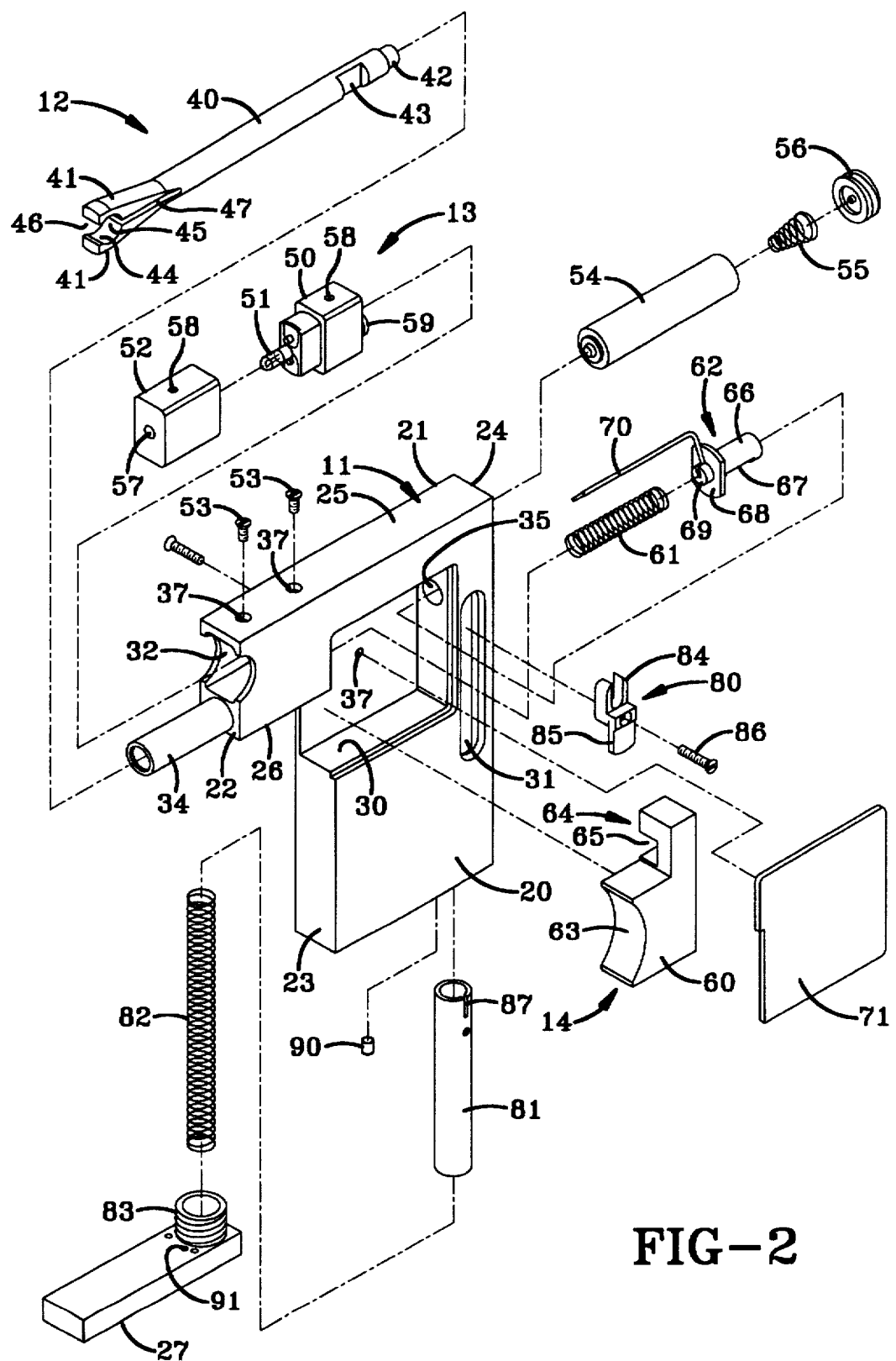
FIG. 2 is an exploded perspective view of the improved fuse extraction tool of FIG. 1.
Figure 14:
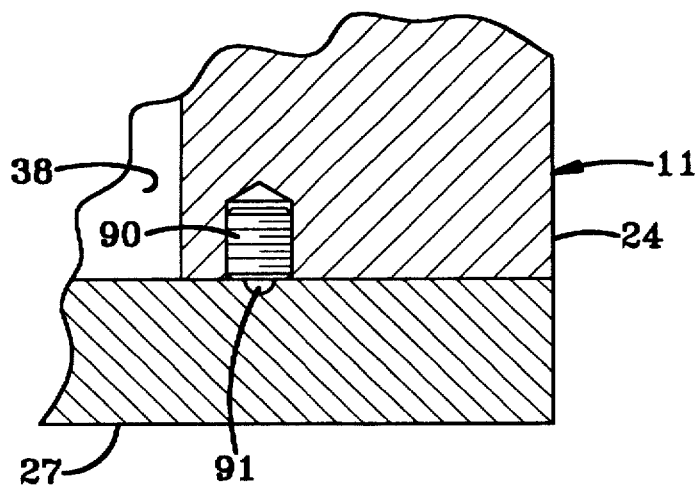
FIG. 14 is an enlarged sectional view of the adjustable door lock mechanism at the entry to the fuse storage cavity.

In addition, the bottom face 27 is pivotable around its threadable connection to the main base 11 through base 83 at fuse tester housing cavity 36. A spring-loaded plunger 90 as is shown in FIGS. 2 and 14 is seated within the main body 11 and extends therefrom such that it selectively engages one of holes 91 thereby securing the bottom face 27 in place as desired in either a closed, partially open, or fully open position.

Overall, the fuse extractor 10 includes a lighting circuit and a testing circuit. The lighting circuit is defined as extending out of the positive end of the battery 54, that is the end of the battery nearest the light mechanism 13, and into the light base 50 and light bulb 51. The circuit further extends through the spring loader activator button 59 where the circuit is controlled by the position of button 59. Specifically, the circuit is broken when the trigger is depressed because the trigger act to depressed button 59, while the circuit complete when the trigger is engaged thereby allowing the spring bias button to extend away from light base 50. Thus, when trigger 60 is depressed, button 59 is fully extended and an electrical current can run completely through the circuit thereby illuminating light bulb 51.

The testing circuit extends out of the light base 50 and function irrespective of the position of button 59. Specifically, the testing circuit is in parallel with button 59 from battery 54. The testing circuit extends out from light base 50 prior to button 59 whereby the circuit extends through connection wire 70, flange portion 68 with a spring seat 69, and into tubular base portion 66 with flat base 67. At this point, the circuit is broken when handle 80 is fully biased within cavity 36 such that the handle 80 is adjacent flat face 67 as shown in FIGS. 3–6. However, handle 80 is slidable within cavity 36 so as to insert a fuse such as fuse 100 or 110 as it is shown in FIGS. 10–13, the fuse engages flat face 67 at one end of the fuse while the other end of the fuse electrically completes the circuit back to the battery 54. Therefore, if the fuse is good, the fuse acts as a conduit through which current passes thereby closing or completing the circuit such that the light bulb 51 is illuminated. Otherwise, the circuit remains open such that the light bulb 51 does not illuminate and the indication is given that the fuse is bad. The fuse may then be removed such that spring 82 biases handle 80 back towards flat face 67.

Having now described and shown in detail the parts and assembly of the fuse extractor, the following is an explanation of its operation. The fuse extractor operates to perform several major functions. First, any partial pulling of the trigger 60 activates button 59 thereby completing the circuit resulting in the lighting of light bulb 51. Second, any complete pulling of the trigger 60 causes the gripping arms to converge together resulting in the fuse extractor mechanically extracting a fuse from the fuse block if a fuse was between the arms. Third and separately, handle 80 is slidable so as to insert a fuse within the tester mechanism 15 whereby a good fuse completes the circuit thereby causing the light bulb 51 to light up.

Figure 3:
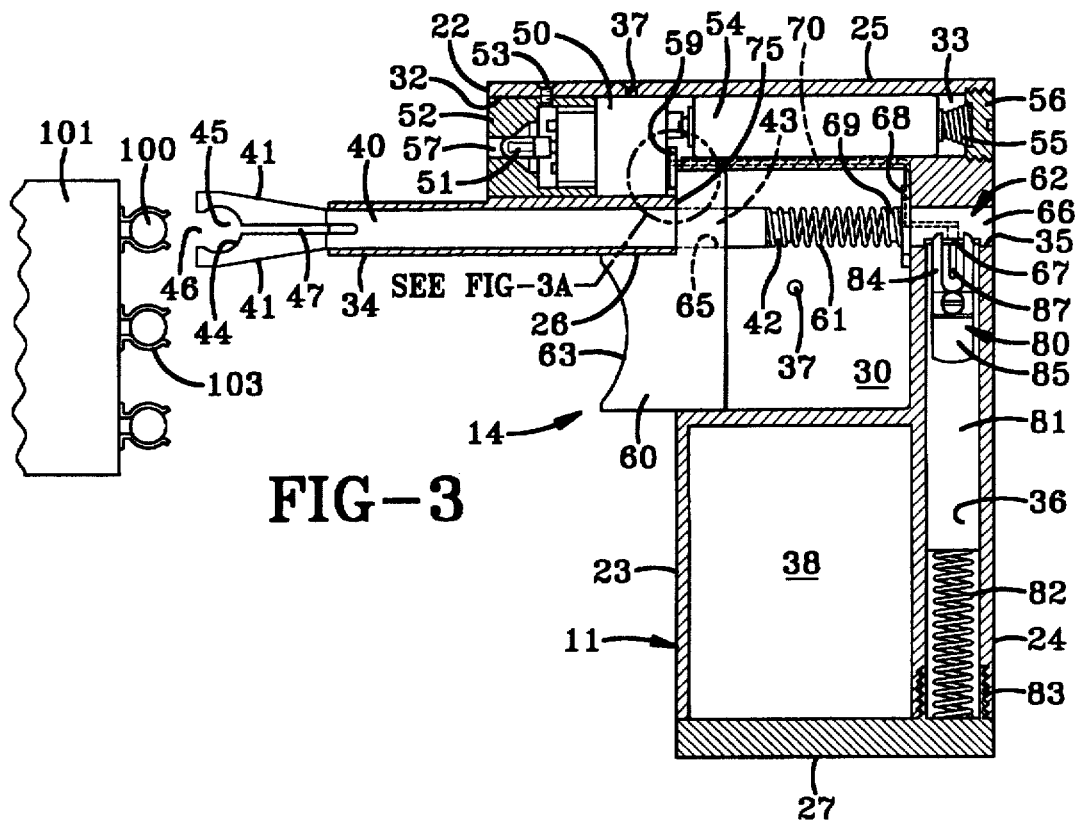
FIG. 3 is a side sectional view showing the inside of the improved fuse extraction tool of FIG. 1 with the gripper arms or jaws in an open position.

Specifically, FIG. 3 shows the fuse extractor 10 in a nonactuated position with trigger 60 fully extended as a result of the bias of spring 61. This complete extending of trigger 60 causes the rod engaging section 64 to depress spring-loaded activator button 59. This depression of button 59 disconnects the circuit within the light base. The result is that the light bulb 51 is not lit.

Figure 4:
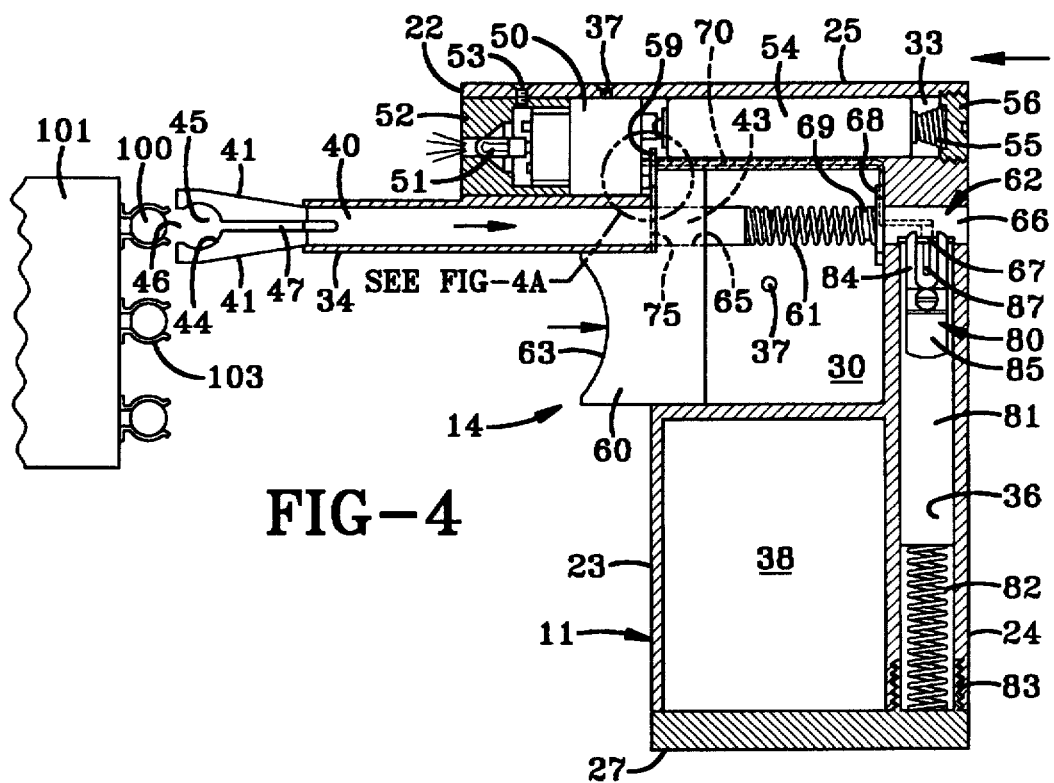
FIG. 4 is the same side view as FIG. 3 except the trigger has been slightly actuated resulting in activation of the spot light.
Figure 3A:
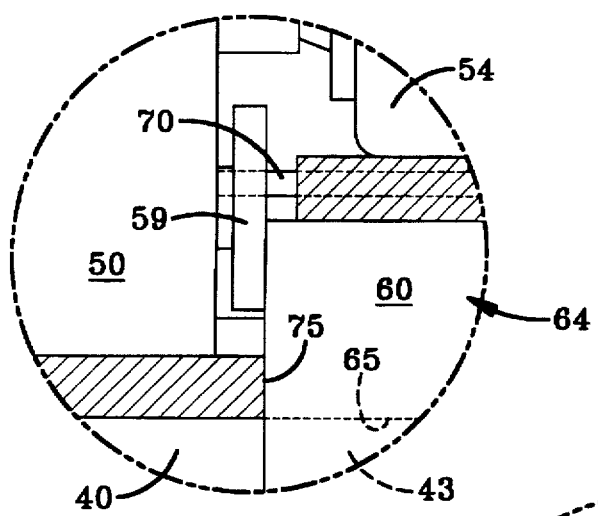
FIG. 3A is an enlarged fragmentary sectional view taken from FIG. 3.
Figure 4A:
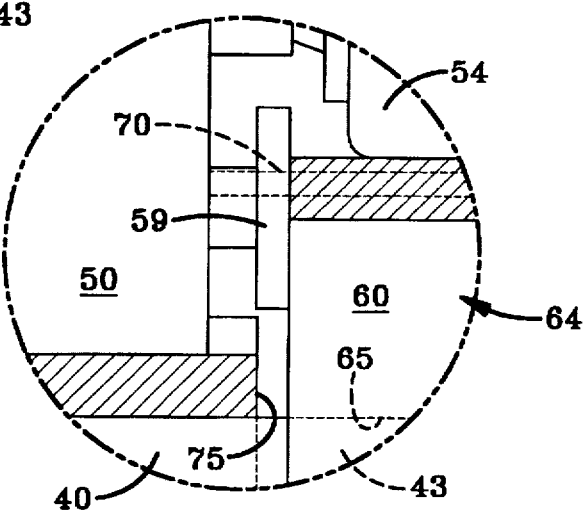
FIG. 4A is an enlarged fragmentary sectional view taken from FIG. 4.

If light is desired, trigger 60 may be slightly depressed as is shown in FIG. 4 to electrically excite the light bulb 51. The depressing of trigger 60 causes rod 40 to move slightly within the tubular extension 34 thereby pulling the arms 41 just slightly into or adjacent the tubular extension 34. The result of this slight depression is the compression of spring 61 and the movement of rod engaging section 64 of trigger 60 such that spring loaded activator button 59 is no longer depressed inward by section 64. The spring within the button 59 thereby biases the button outward into contact with the main body 11 (FIG. 4) which acts as ground and completes the circuit resulting in the lighting of the light bulb 51.

When it is desirous to remove a fuse, such as a barrel type fuse 100 as is shown in FIGS. 3–6 on a fuse block 101, and the fuse extractor is properly aligned in front of the selected fuse as is shown in FIG. 4, the fuse extractor 10 is pressed over the center of the barrel of the fuse. The gripper arms 41 separate as the fuse pushes through gap 46 thereby temporarily widening the gap. The fuse after passing through gap 46 is thus seated within the cylindrical fuse engaging or holding cavity 45 and the gripping arms return to their original positions.

Figure 5A:
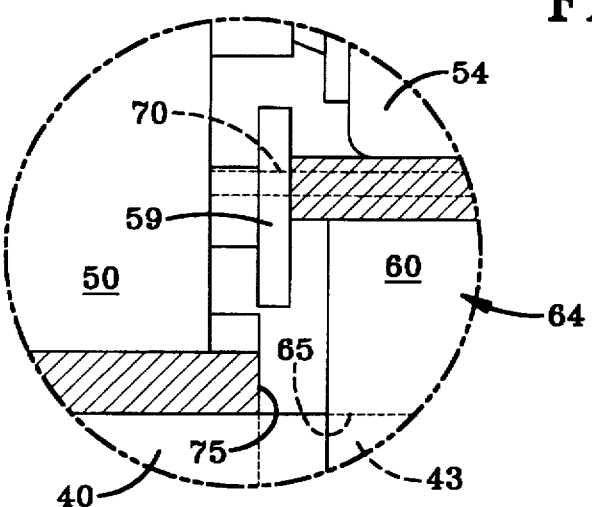
FIG. 5A is an enlarged fragmentary sectional view taken from FIG. 5.
Figure 5:
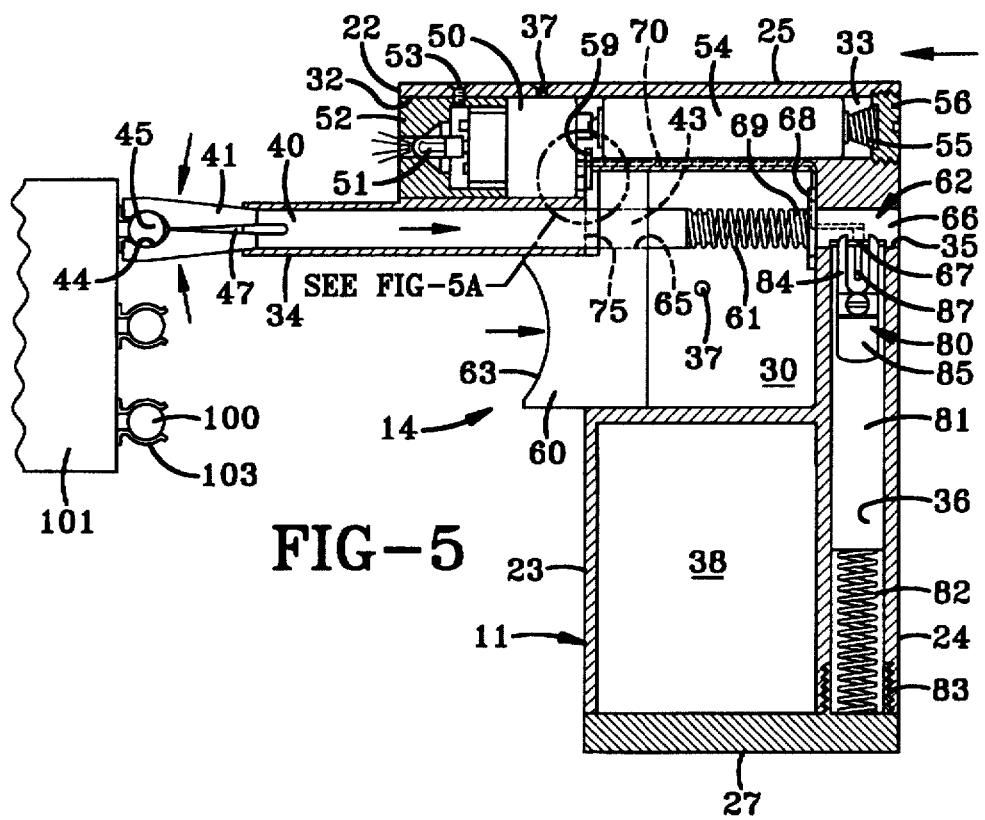
FIG. 5 is the same side view as FIGS. 3 and 4 except the trigger has been fully actuated causing the jaws to close around and engage one of the barrel type fuses.

After the fuse is seated in the cylindrical cavity 45, the trigger 60 is then fully depressed causing the gripper arms 41 to close and tightly engage the fuse 100 as is shown in FIG. 5. Specifically, the depressing of the trigger 60 forces the rod 40 further into the tubular extension 34 by compressing the spring 61 against the flange 68. The gripper arms 41 which were previously pulled slightly into or adjacent the rod to light the light bulb, are now pulled further into the tubular extension 34. The arms are specifically pulled into the rod to the extent that the arms are forced to converge slightly toward each other because the arms are wider across than the diameter of the tubular extension. This convergence causes the slot 47 to close as is shown in FIG. 5. The result is a reduction in gap 46 to the extent that a fuse can no longer be forced therethrough.

Figure 6:
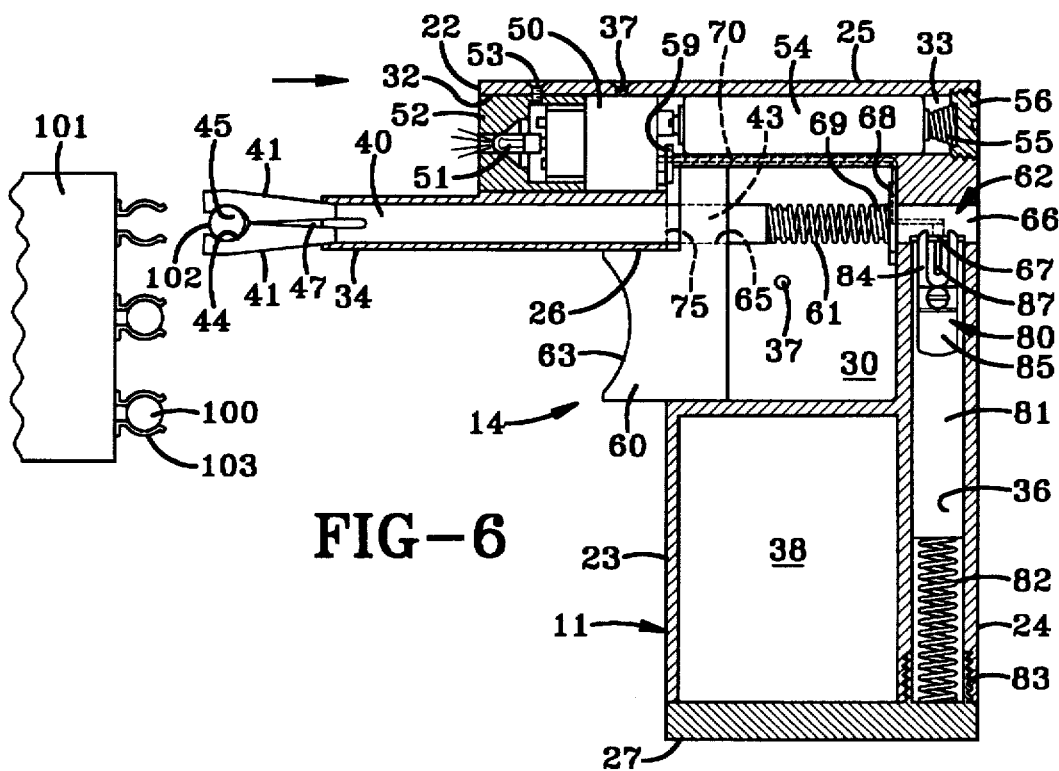
FIG. 6 is the same side view as FIGS. 3–5 except that the entire fuse extractor has been pulled away from the fuse block thereby extracting the engaged barrel type fuse of FIG. 5.
Figure 11:
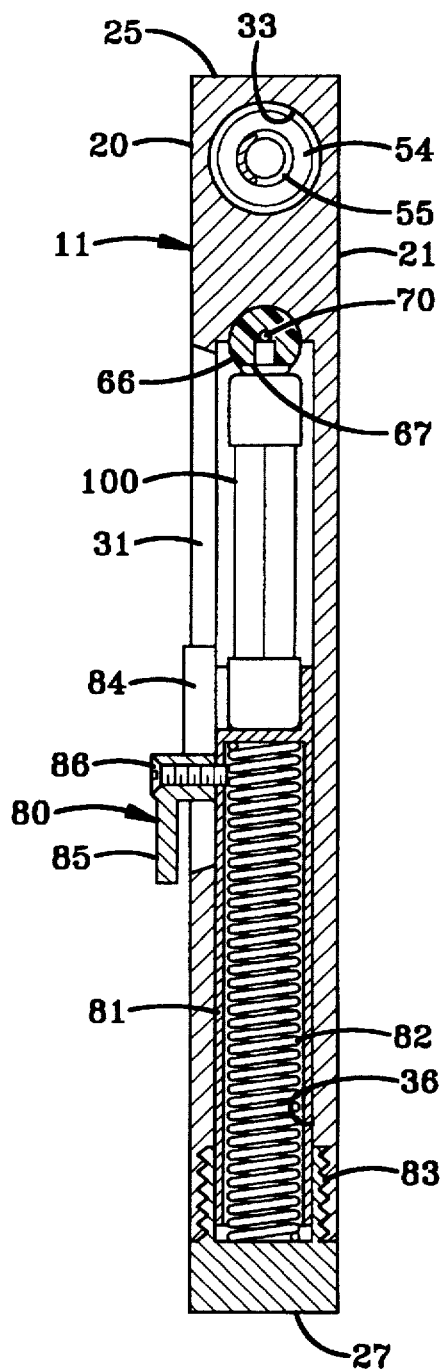
FIG. 11 is a sectional view taken along line 11—11 in FIG. 10 showing the fuse tester with a barrel type fuse therein.
Figure 13:
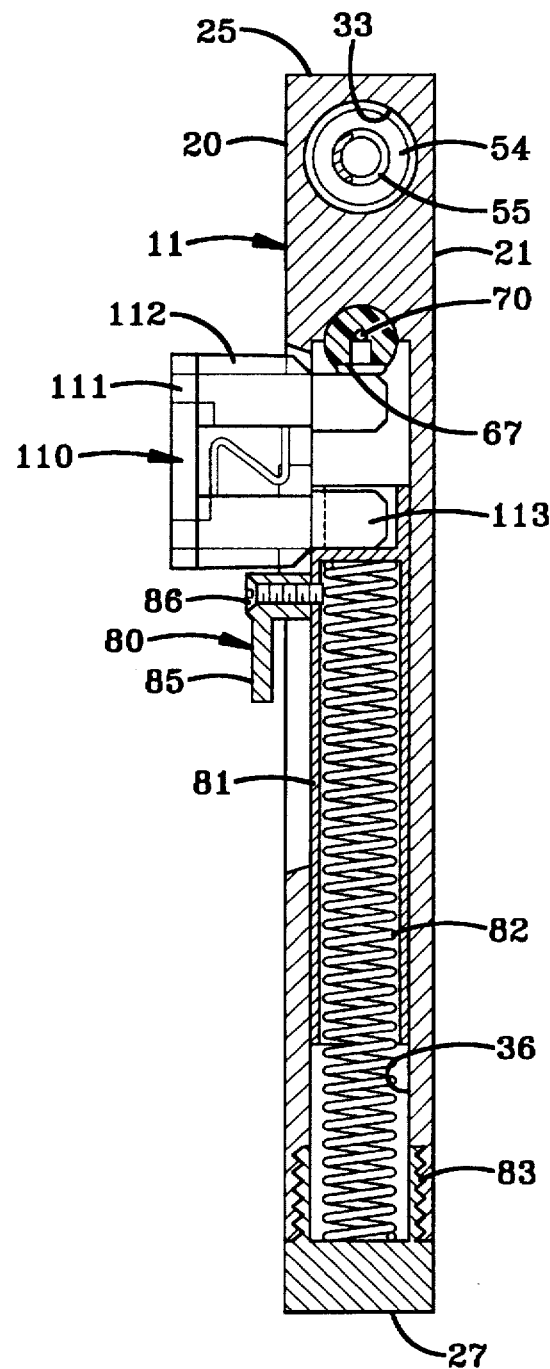
FIG. 13 is a sectional view taken along line 13—13 in FIG. 12 showing the fuse tester with a flat prong type fuse therein.

The barrel type fuse 100 is then removed from the fuse block 101 by pulling the fuse extractor 10 away from the fuse block 101 as is shown in FIG. 6. As clearly shown in FIG. 6, the barrel type fuse is an elongated cylinder 102 which typically has conductive caps on each end that engage the pair of curved conductors 103.

The fuse extractor 10 also removes flat prong type fuses 110 as shown in FIGS. 7–9. The approximately cylindrical fuse engaging cavity 45 is shaped so as to be capable of engaging either a cylinder which is the shape of the barrel type fuse, or a flat enlarged head which is the shape of the head on a flat prong type fuse which has a narrower body than head. As shown in FIG. 9, the flat prong fuse 110 has an insulative head 111, a narrower insulative body 112 with the fuse therein, and a pair of conductors 113 extending therefrom for insertion into a female plug in the fuse block 101. The fuse extractor 10 functions in the same manner for flat prong type fuses as barrel type fuses as described above except instead of tightly engaging the center of the elongated cylinder on the barrel type fuse, the extractor grabs the insulative head 111 within the approximately cylindrical fuse engaging cavity 45 as shown in FIGS. 8–9.

Figure 12:
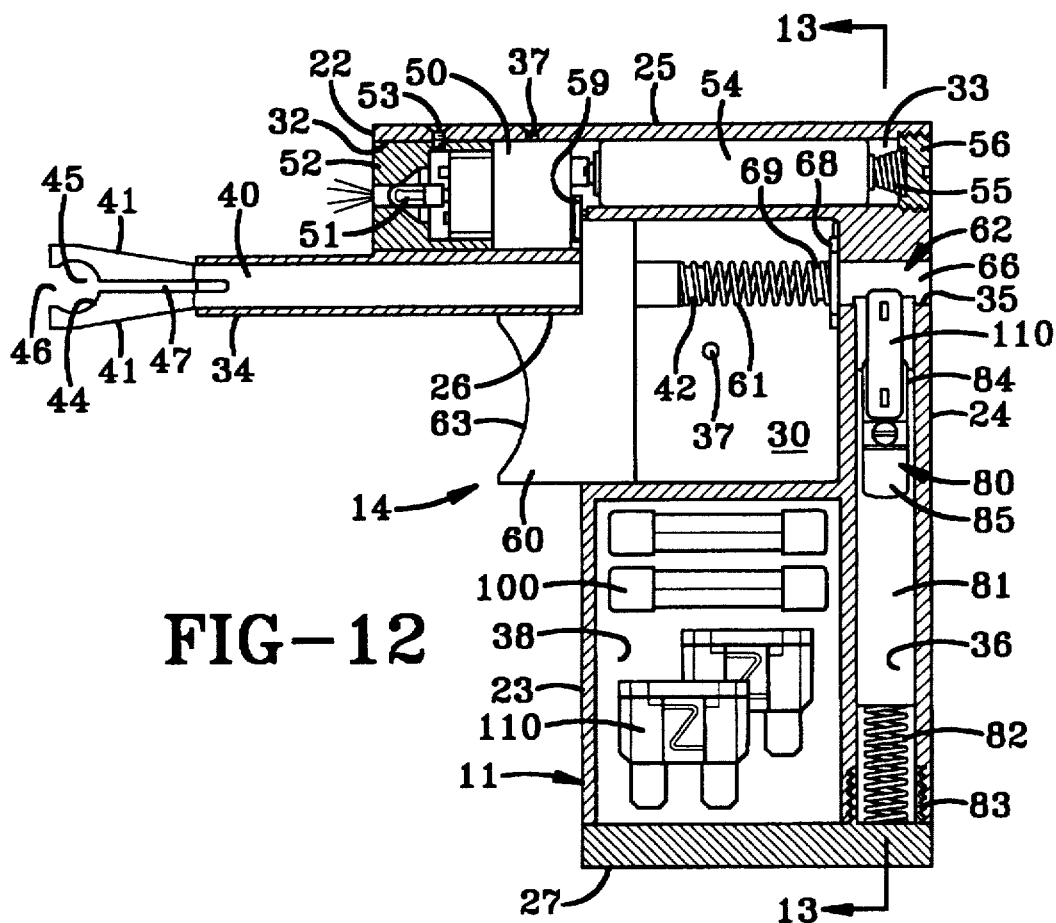
FIG. 12 is a side sectional view of the improved fuse extractor with spare fuses stored in the storage compartment and with a flat prong type fuse inserted into the fuse tester.

The fuse extractor 10 also functions to test both barrel type and flat prong fuses as shown in FIGS. 10 and 12 respectively. Specifically, the extractor tests the fuse to determine whether electricity still flows through the fuse and indicates a positive result by lighting up the light and a negative result by not lighting up the light. In operation, the handle 80 is slid away from the flat face 67 thereby defining and exposing a channel in which the fuse is inserted. By moving the handle 80 away from and out of contact with the flat face 67, a space is created for fuse insertion. In the case of a barrel type fuse 100, the fuse is inserted longitudinally such that one conductive cap engages the flat face 67 and the other engages the sleeve 81 and fits in behind the handle 80. In the case of the flat prong type, the conductors 113 plug into the channel, with one of the flat conductors specifically sliding in a narrow slot 86 in the handle 80 thereby supplying support to hold the flat prong conductor in place. After the handle 80 is released such that the handle 80 returns toward the flat face 67 as far as possible, that is into engagement with the fuse in the channel, the tester is activated thereby completing the circuit. The fuse thus acts to re-complete the circuit assuming the fuse is not blown and thereby illuminate the light.

Accordingly, the improved fuse extracting tool and tester is simplified, provides an effective, safe, inexpensive, and efficient device which achieves all the enumerated objectives, provides for eliminating difficulties encountered with prior devices, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved fuse extracting tool and tester is constructed and used, the characteristics of the construction, and the advantageous, new and useful results obtained; the new and useful structures, devices, elements, arrangements, parts and combinations, are set forth in the appended claims.

I claim:

1. A fuse extractor for extracting fuses from a fuse block comprising:

an extractor body;

means for extracting a fuse from a fuse block, the extraction means attached to the extractor body, the extraction means including means for gripping the fuse and trigger means for actuating the gripping means to grip the fuse; and means for illuminating the fuse block, the illumination means attached to the trigger means whereby actuation of the trigger means causes illumination of the illumination means.

2. The fuse extractor as defined in claim 1 in which the extractor body further comprises an elongated chamber.

3. The fuse extractor as defined in claim 2 in which the extracting means further comprises an elongated extractor arm axially slidable within the elongated chamber.

4. The fuse extractor as defined in claim 3 in which the extracting means further comprises a pair of gripper arms extending from the elongated extractor arm.

5. The fuse extractor as defined in claim 4 in which the gripper arms together define a fuse holding cavity with a fuse entrance gap, and where the gripper arms are separated by a slot where each arm is flexible enough to bend as needed to open the slot to allow a fuse to pass through the fuse entrance gap and to close the slot to tightly engage a fuse positioned within the fuse holding cavity.

6. The fuse extractor as defined in claim 5 in which the trigger means includes a trigger slidable within a chamber in the extractor body, the trigger means attached to the elongated extractor arm and movable within the chamber so as to flex the gripper arms to close the slot when the gripper arms are pulled into the elongated chamber.

7. The fuse extractor as defined in claim 6 in which the trigger means further comprises an activator button movably abutting the trigger such that depressing of the trigger releases the activator button.

8. The fuse extractor as defined in claim 7 in which the activator button is biased open by a button spring.

9. The fuse extractor as defined in claim 8 in which the trigger is biased open by a trigger spring causing the activator button to be depressed rather than open.

10. The fuse extractor as defined in claim 9 further comprising a fuse tester attached to the extractor body.

11. The fuse extractor as defined in claim 1 in which the trigger means further comprises an activator button movably abutting a trigger in the trigger means such that depressing of the trigger releases the activator button.

12. The fuse extractor as defined in claim 11 in which the activator button is biased open by a button spring, and the trigger is biased open by a trigger spring causing the activator button to be depressed rather than open.

13. The fuse extractor as defined in claim 1 further comprising a fuse tester attached to the extractor body.

14. The fuse extractor as defined in claim 13 in which the fuse tester further comprises a fuse receiving channel in which a spring loaded actuator handle slides.

15. The fuse extractor as defined in claim 14 in which the fuse tester is electrically connected to the illumination means.

16. The fuse extractor as defined in claim 15 in which the fuse tester is adapted to test both barrel type fuses and flat prong type fuses.

17. The fuse extractor as defined in claim 1 further comprising storage means for receiving spare fuses.

18. The fuse extractor as defined in claim 17 in which the storage means includes a recess formed in the extractor body.

19. The fuse extractor as defined in claim 18 in which a door is positioned over the recess and is movable between an open position and a closed position.

20. A fuse extractor as defined in claim 1 in which the extractor body is pistol grip shaped.

21. A fuse extractor capable of extracting both barrel type and flat prong type fuses from a fuse block comprising:

an extractor body having an elongated chamber therein;

an elongated extractor arm axially slidable within the elongated chamber, the elongated extractor arm having a pair of gripper arms extending therefrom, the gripper arms together defining a generally cylindrical fuse holding cavity which is adapted to receive the barrel type fuse and including opposed outer ends adapted to receive the flat prong type fuse therebetween, said gripper arms are spaced to form a fuse entrance gap, and are separated by a slot;

a trigger connected to the elongated extractor arm and movable within the extractor body to move the extractor arm within the elongated chamber; and a light electrically connected to a circuit in which a button is actuated by the trigger.

22. The fuse extractor as defined in claim 21 further comprising a fuse tester.

23. The fuse extractor as defined in claim 21 further comprising a fuse tester electrically connected to the circuit and light, the fuse tester comprising an elongated channel in which a handle actuator is spring loaded to engage a fuse positioned therein.

24. A fuse extractor as defined in claim 21 in which the extractor body is pistol grip shaped.

25. A fuse extractor capable of extracting both barrel type and flat prong type fuses from a fuse block comprising:

an extractor body having an elongated chamber therein;

an elongated extractor arm axially slidable within the elongated chamber, the elongated extractor arm having a pair of gripper arms extending therefrom, the gripper arms together defining a generally cylindrical fuse holding cavity which is adapted to receive the barrel type fuse and including opposed outer ends adapted to receive the flat prong type fuse therebetween, said gripper arms are spaced to form a fuse entrance gap, and are separated by a slot;

a trigger connected to the elongated extractor arm and movable within the extractor body to move the extractor arm within the elongated chamber; and storage means for receiving spare fuses.

26. The fuse extractor as defined in claim 25 in which the storage means includes a recess formed in the extractor body.

27. A fuse extractor capable of extracting both barrel type and flat prong type fuses from a fuse block comprising:

an extractor body having an elongated chamber therein;

an elongated extractor arm axially slidable within the elongated chamber, the elongated extractor arm having a pair of gripper arms extending therefrom, the gripper arms together defining a fuse holding cavity with a fuse entrance gap, and the gripper arms being separated by a slot;

a trigger connected to the elongated extractor arm and movable within the extractor body to move the extractor arm within the elongated chamber; and a light electrically connected to a circuit in which a button is actuated by the trigger.

* * * * *